United States Patent
Lee et al.

(10) Patent No.: US 8,455,319 B2
(45) Date of Patent: Jun. 4, 2013

(54) VERTICAL TRANSISTOR FOR RANDOM-ACCESS MEMORY AND MANUFACTURING METHOD THEREOF

(75) Inventors: Tzung Han Lee, Taipei (TW); Chung-Yuan Lee, Taoyuan County (TW); Hsien-Wen Liu, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 305 days.

(21) Appl. No.: 13/039,523

(22) Filed: Mar. 3, 2011

(65) Prior Publication Data
US 2012/0193706 A1   Aug. 2, 2012

(30) Foreign Application Priority Data
Feb. 1, 2011   (TW) .............................. 100103946 A

(51) Int. Cl.
  *H01L 21/336*   (2006.01)
  *H01L 29/76*   (2006.01)
(52) U.S. Cl.
  USPC ............ 438/270; 438/272; 257/330; 257/332
(58) Field of Classification Search
  USPC .................. 438/259, 269–272, 589; 257/330, 257/332, 334, E21.419, E21.629, E21.655, 257/E29.26
See application file for complete search history.

(56) References Cited

U.S. PATENT DOCUMENTS

| | | | |
|---|---|---|---|
| 8,169,023 B2 * | 5/2012 | Akiyama et al. .............. | 257/341 |
| 8,173,508 B2 * | 5/2012 | Sumida et al. ................ | 438/270 |
| 2010/0276757 A1 * | 11/2010 | Doyle et al. ................... | 257/368 |

* cited by examiner

*Primary Examiner* — Hung Vu
(74) *Attorney, Agent, or Firm* — Rosenberg, Klein & Lee

(57) ABSTRACT

A manufacturing method for a vertical transistor of random-access memory, having the steps of: defining an active region on a semiconductor substrate; forming a shallow trench isolation structure outside of the active region; etching the active region and forming a gate dielectric layer and a positioning gate thereon, forming a word line perpendicular to the positioning gate; forming spacing layers on the outer surfaces of the word line; implanting ions to the formed structure in forming an n-type and a p-type region on opposite sides of the word line with the active region; forming an n-type and a p-type floating body respectively on the n-type and p-type region; forming a source line perpendicular to the word line and connecting to the n-type floating body; forming a bit line perpendicular to the source line and connecting to the p-type floating body. Hence, a vertical transistor with steady threshold voltage is achieved.

10 Claims, 13 Drawing Sheets

VERTICAL TRANSISTOR FOR RANDOM-ACCESS MEMORY AND MANUFACTURING METHOD THEREOF

BACKGROUND OF THE INVENTION

1. Field of the Invention

The instant disclosure relates to a memory device and manufacturing method thereof: more particularly, to a vertical transistor for random-access memory and manufacturing method thereof.

2. Description of Related Art

For the mainstream IC processing, the most common transistor is the MOSFET (metal-oxide-semiconductor field-effect transistor). Like typical transistors, the current flows through the channel region of the MOSFET. In particular, n-type MOSFET (nMOSFET, nMOS) is provided with conducting electrons, whereas p-type MOSFET (pMOSFET, pMOS) uses conducting "holes" for operation.

FIG. 1 shows a typical p-type MOSFET (pMOS), which comprises an n-type substrate 1a, a gate 2a, and two spacers 3a. As a source and a drain, a first doping area 11a and a second doping area 12a are disposed on the n-type substrate 1a. An oxide film 13a is disposed on the n-type substrate 1a. The gate 2a is disposed on the oxide layer 13a, and the spacers 3a are disposed on the sides of the gate 2a over the oxide layer 13a. The source, drain, and the gate 2a of the above-described pMOS are arranged horizontally, which occupy more surface of the n-type substrate 1a. Thus, the packing density of the semiconductor element is restricted. In addition, after repeated read or write access operation, electric charge accumulation tends to occur. The threshold voltage $V_t$ becomes more fluid, rendering the pMOS to be less stable.

SUMMARY OF THE INVENTION

The instant disclosure encompasses a vertical transistor for random-access memory and manufacturing method thereof. The disclosed vertical transistor can maintain a steady threshold voltage and improve packing density of semiconductor elements.

In one aspect, the instant disclosure encompasses a manufacturing method of vertical transistor for random-access memory. The manufacturing steps include: defining an active region of a semiconductor substrate and forming a shallow trench isolation structure outside the active region; etching the active region, forming a gate dielectric layer and a positioning gate therein, and forming a word line perpendicular to the positioning gate and forming spacing layers on the outer surface of the word line; implanting ions to form an n-type region and a p-type region respectively for the active region on opposite sides of the word line; covering the above-described structure with an insulating layer: removing the insulating layer partially to form a source line pattern by the self-align contact (SAC) technique; forming two floating bodies by epitaxial deposition and implanting with ions to form an n-type floating body on the n-type region of the active region and a p-type floating body on the p-type region of the active region, and covering the above-described structure with an insulating layer; removing the insulating layer corresponding to the n-type floating body by the self-align contact technique, and forming a source line perpendicular to the word line and connecting to the n-type floating body; covering the above-described structure with an insulating layer and removing the insulating layer corresponding to the p-type floating body by the self-align contact technique; forming a bit line perpendicular to the source line and connecting to the p-type floating body.

In another aspect, the instant disclosure encompasses a vertical transistor for random-access memory fabricated by the above-described manufacturing method.

Based on the above, the transistor fabricated by the manufacturing method of vertical transistor for random-access memory can maintain a steady threshold voltage ($V_t$) and improve packing density by significantly reducing the occupied space of the transistor in the horizontal direction.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

BRIEF DESCRIPTION OF THE DRAWINGS

FIGS. 2-1 and 2-2 show a flow diagram of the instant disclosure.

DETAILED DESCRIPTION OF PREFERRED EMBODIMENTS

Figure 1:
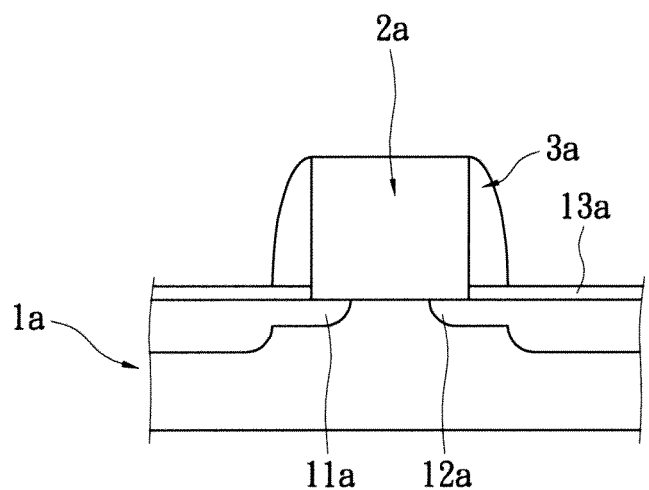
FIG. 1 shows a schematic view of a metal-oxide-semiconductor field-effect transistor (MOSFET) of the related art.
Figures 1, 2:
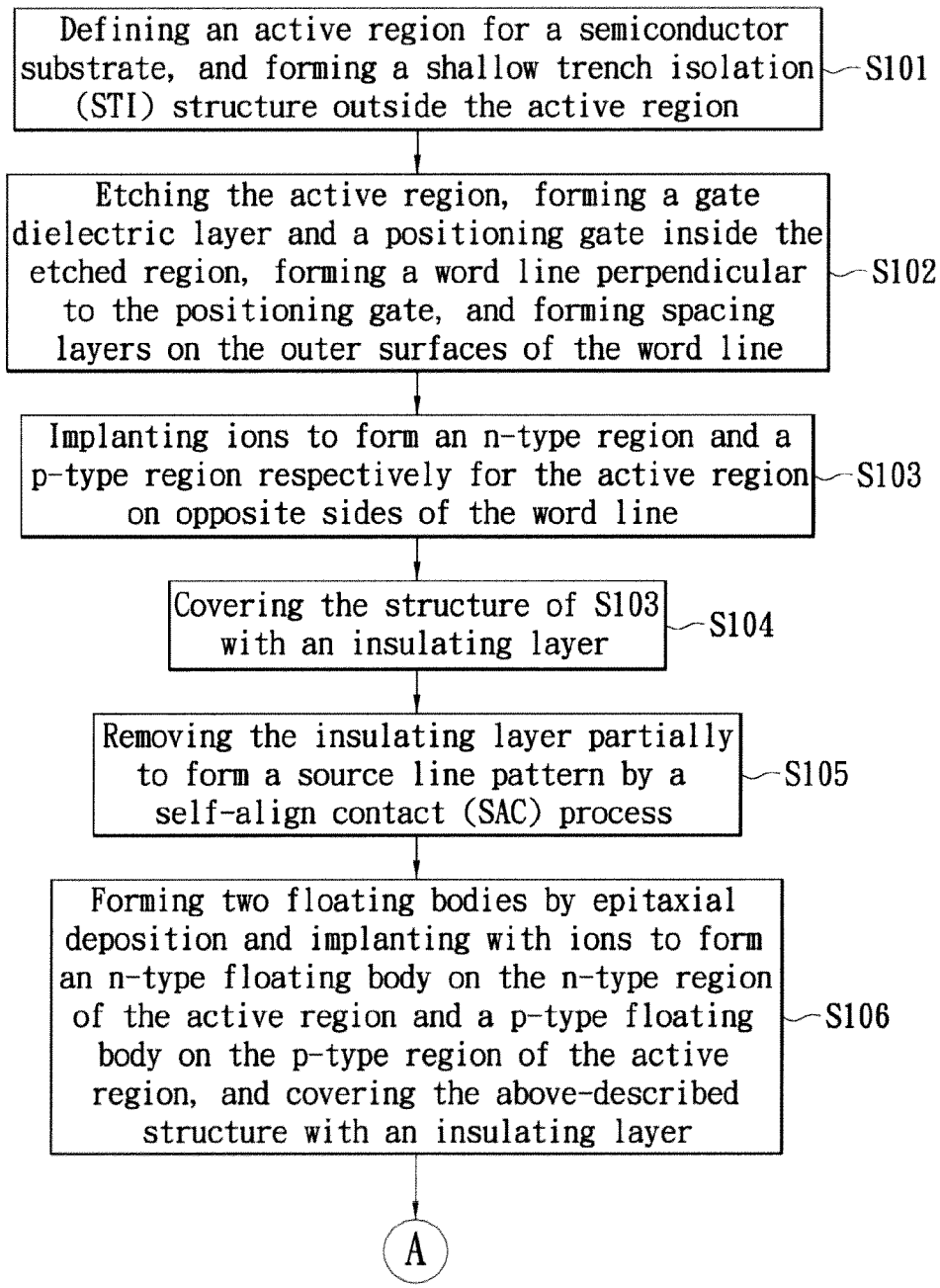
Figure 2:
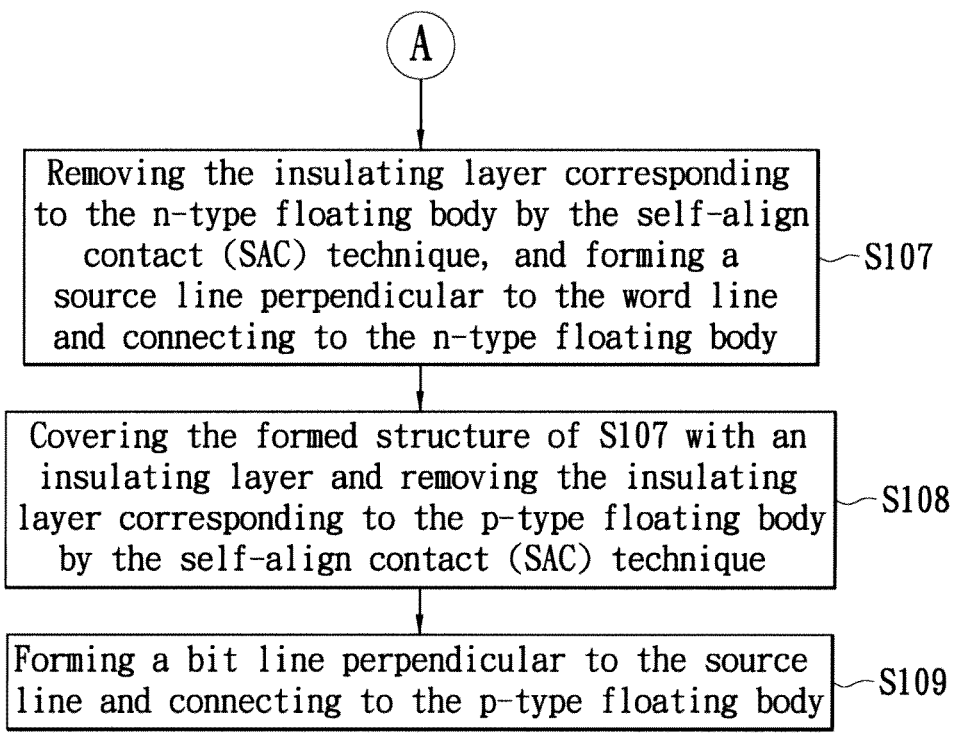
Figure 10A:
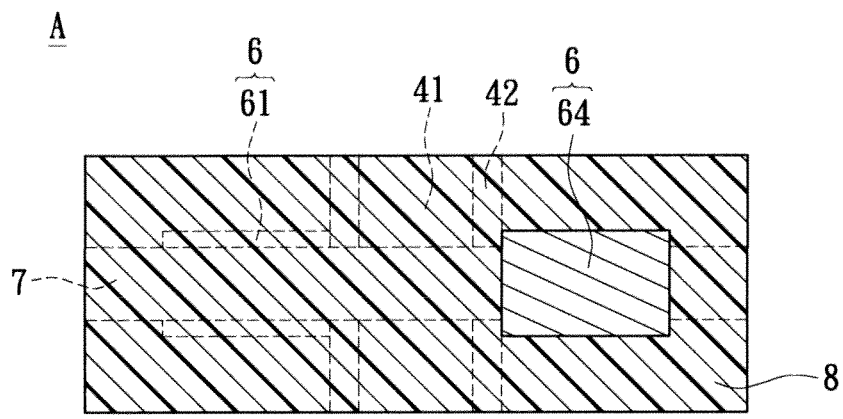
FIG. 10A shows a top view for a manufacturing step S108 of the instant disclosure.
Figure 10B:
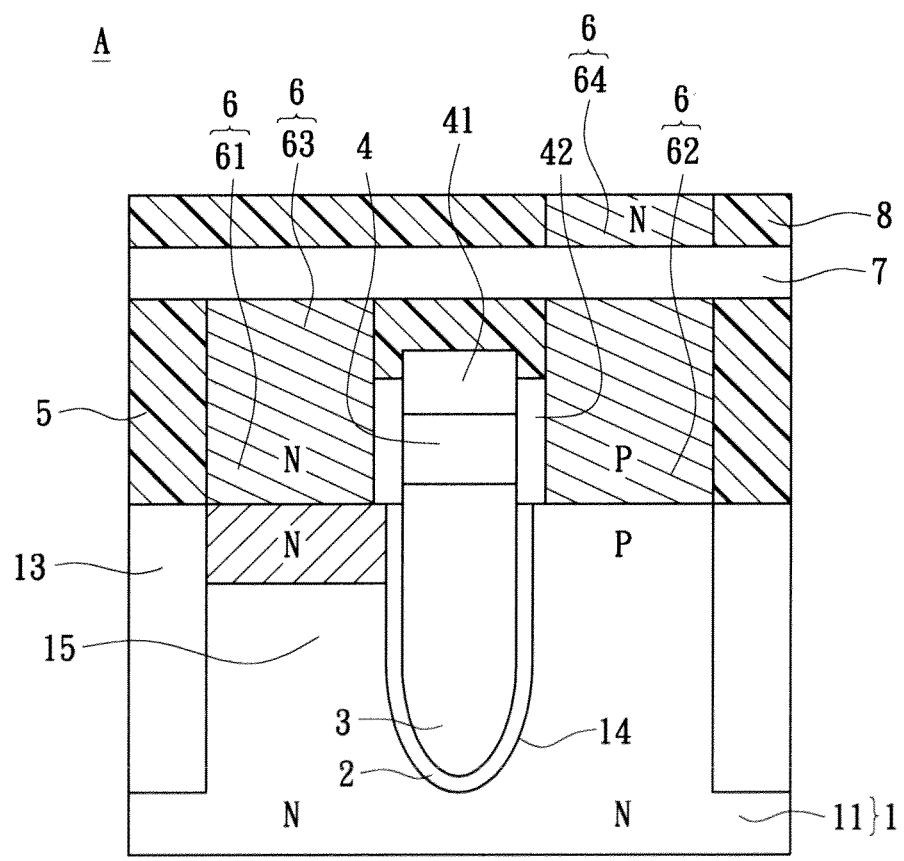
FIG. 10B shows a sectional view of FIG. 10A.
Figure 11A:
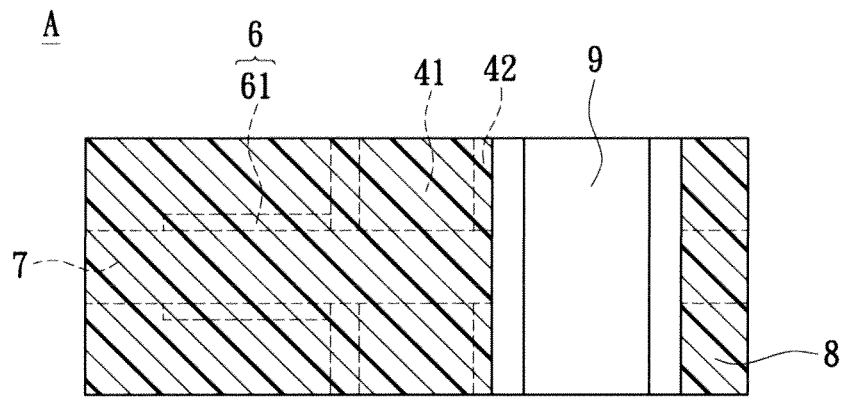
FIG. 11A shows a top view for a manufacturing step S109 of the instant disclosure.
Figure 11B:
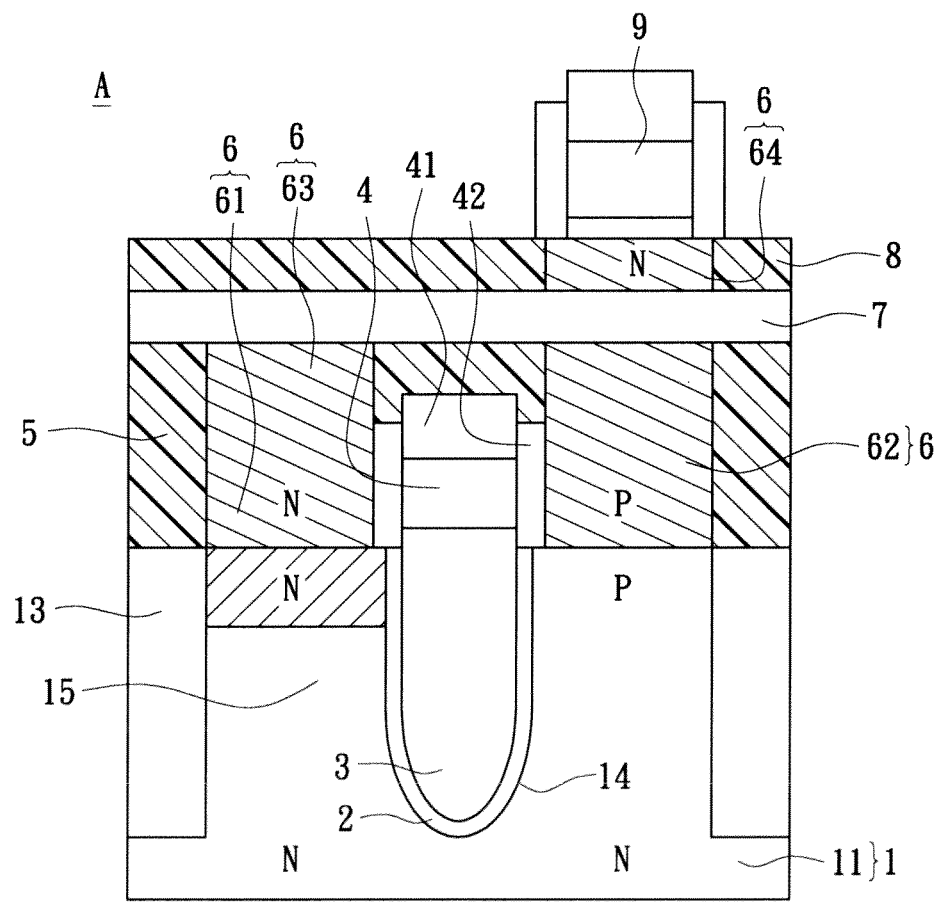
FIG. 11B shows a sectional view of FIG. 11A.

Please refer to FIGS. 2-1-11B, wherein FIGS. 2-1 and 2-2 show a flow diagram of the instant disclosure, while FIGS. 3A-11B show plan views of the instant disclosure.

FIGS. 2-1 and 2-2 correspond to FIGS. 3A to 11B, wherein FIGS. 2-1 and 2-2 refer to a manufacturing method of vertical transistor for random-access memory.

Figure 3A:
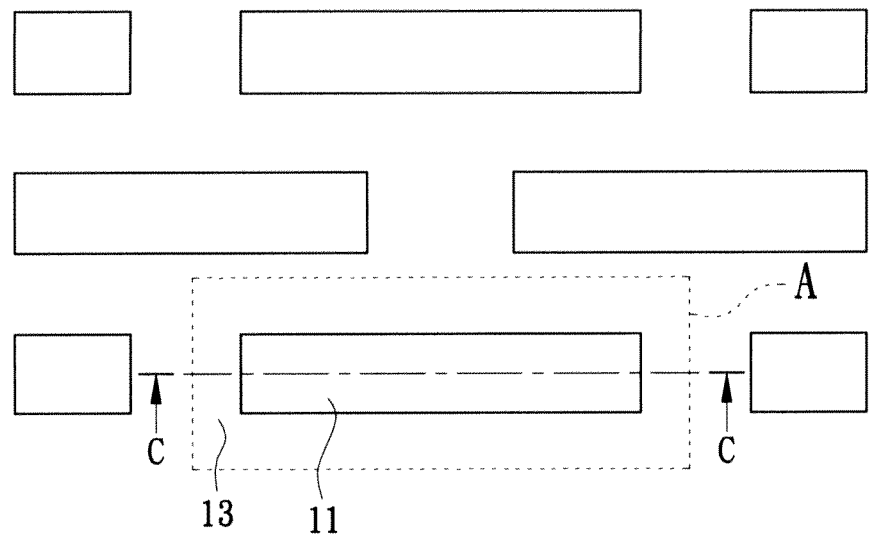
FIG. 3A shows a top view for a manufacturing step S101 of the instant disclosure.
Figure 3B:
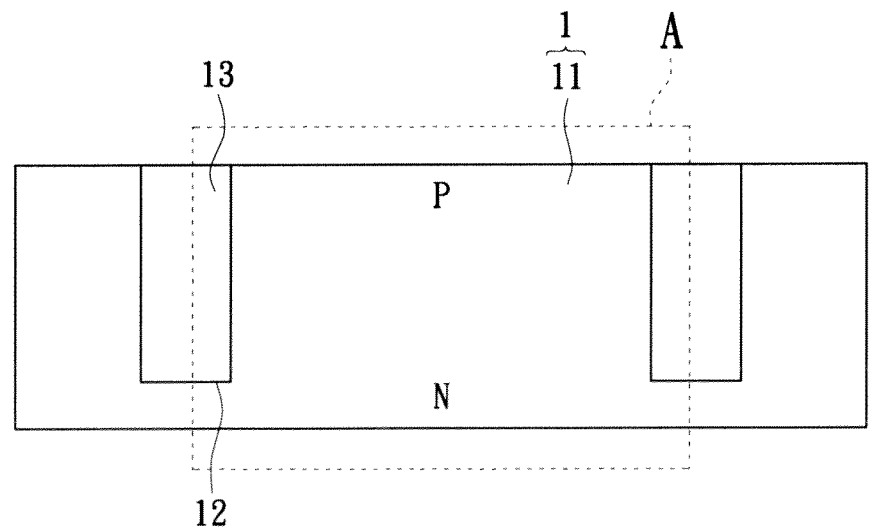
FIG. 3B shows a sectional view of FIG. 3A.

FIGS. 3A and 3B are graphical illustrations of step S101 and represent a part of a memory device. The part of the memory device is made up by a plurality of unit regions. For the instant embodiment, a unit region A is selected for explanation purpose. FIG. 3A is a top view for part of the memory device, and FIG. 3B is a sectional view of FIG. 3A.

First, an active region 11 of a semiconductor substrate 1 of the unit region A is defined. Next, the semiconductor substrate 1 is etched to form trenches 12. Dielectric material is deposited to fill the trenches 12 to create shallow trench isolation (STI) structure 13. Chemical-mechanical planarization/polishing (CMP) is used to remove the excess for smoothing the surface. Ions are implanted to the semiconductor substrate 1, forming an n-type region for the lower portion thereof and a p-type region for the upper portion thereof.

The material for the semiconductor substrate 1 can be epitaxial layer, silicon, gallium arsenide, gallium nitride, strained silicon, germanium silicide, silicon carbide, diamond, or other materials.

The aforementioned STI structure 13 is formed by the shallow trench isolation process, which is a widely used technique by people in the semiconductor industry, therefore is not described in details herein. When implanting the ions, the ions can be zinc ($Zn^{2+}$), fluorine ($F^-$), nitrogen ($N^-$), oxygen ($O^{2-}$), carbon ($C^{4+}$), argon ($Ar^+$), boron ($B^+$), phosphorus ($P^+$), arsenic ($As^+$), or antimony ($Sb^{2+}$). However, for industrial applications, the ions are not limited thereto.

Figure 4A:
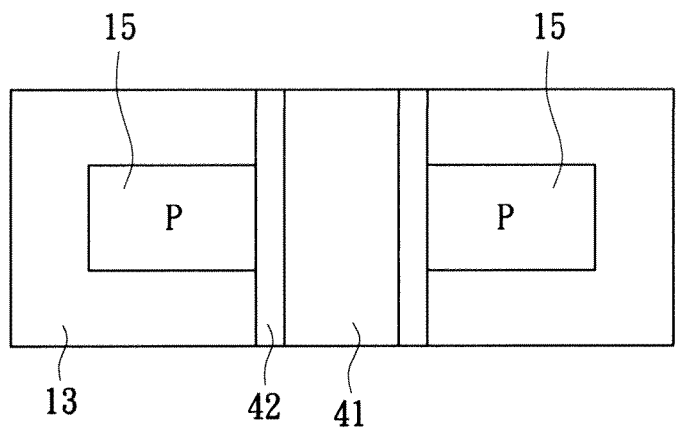
FIG. 4A shows a top view for a manufacturing step S102 of the instant disclosure.
Figure 4B:
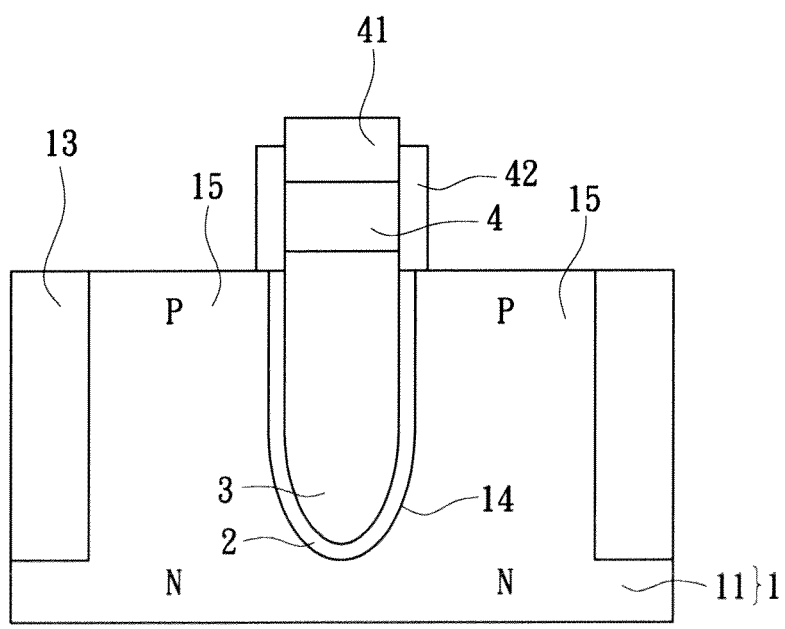
FIG. 4B shows a sectional view of FIG. 4A.

Please refer to FIGS. 4A and 4B, which correspond to step S102. FIG. 4A is a top view of the unit region A, while FIG. 4B is a sectional view of FIG. 4A. For step S102, the active region 11 of the unit region A is etched to a pre-determined depth for forming a vertical positioning groove 14 and defined by sidewall portions 15. The sidewall portions 15 act as the channel region for current flow, and the thickness thereof significantly affects the transistor operation. Next, a gate dielectric layer 2 is disposed onto the formed structure of the unit region A.

Next, a positioning gate 3 is disposed adjacent to the gate dielectric layer 2 to fill the vertical positioning groove 14 of the unit region A. The positioning gate 3 can be made of polysilicon, tungsten, platinum, titanium nitride, tantalum, tantalum nitride, chromium, alloy, or other applicable materials. In addition, the positioning gate 3 is at least partially surrounded by the sidewall portions 15. Specifically, channel regions are formed by the sidewall portions 15 at the front, rear, or in all directions of the positioning gate 3. The electric charge level of the positioning gate 3 controls the conductivity of the sidewall portions 15.

A word line 4 is formed perpendicularly to the positioning gate 3 of the unit region A. A protective layer 41 is disposed on the word line 4, wherein the protective layer 41 can be made of silicon nitride (SiN). A dielectric layer is disposed on the formed structure and anisotropic etching is applied to form spacing layers 42. The word line 4 is not limited in length according to the figures, wherein other unit regions can share the same word line 4 in its path.

Figure 5A:
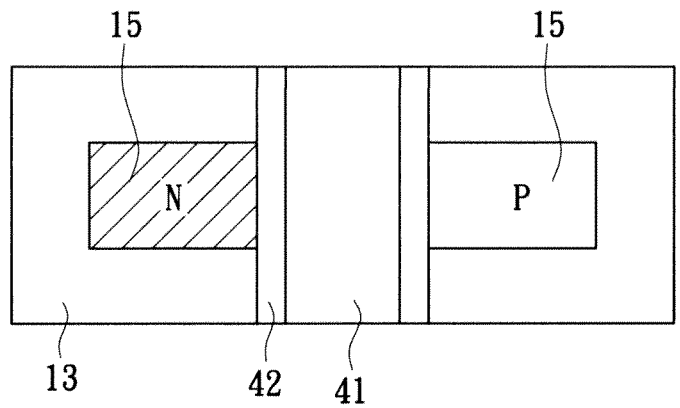
FIG. 5A shows a top view for a manufacturing step S103 of the instant disclosure.
Figure 5B:
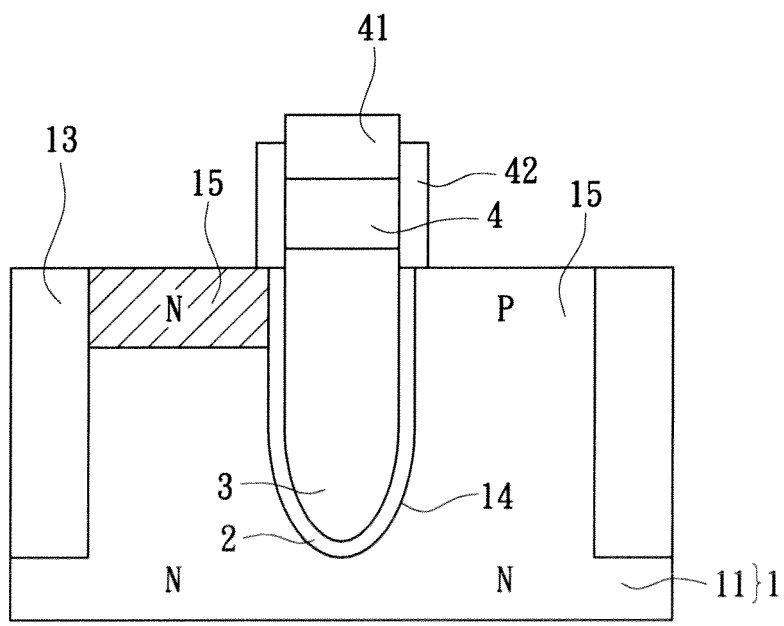
FIG. 5B shows a sectional view of FIG. 5A.

Please refer to FIGS. 5A and 5B, which corresponds to step S103. FIG. 5A shows a top view of the unit region A, wherein FIG. 5B is a sectional view of FIG. 5A. After forming the word line 4, ions are implanted to the formed structure before or after forming the spacing layers 42. Thus, an n-type region is formed on one side of the sidewall region 15 of the active region 11 of the unit region A. In other words, the n-type region and a p-type region are formed oppositely on the sidewall portions 15 of the active region 11 of the word line 4.

Figure 6A:
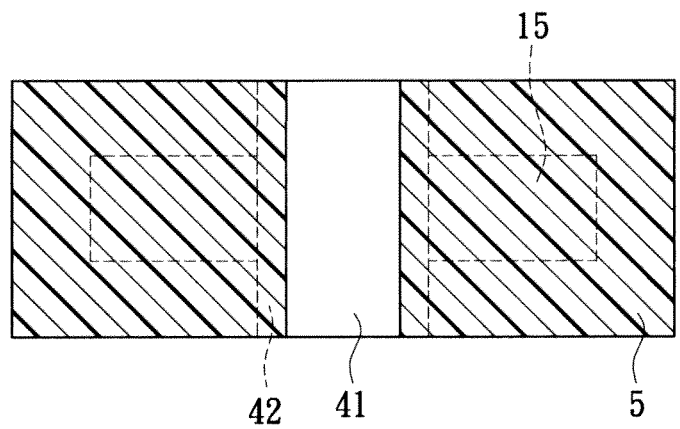
FIG. 6A shows a top view for a manufacturing step S104 of the instant disclosure.
Figure 6B:
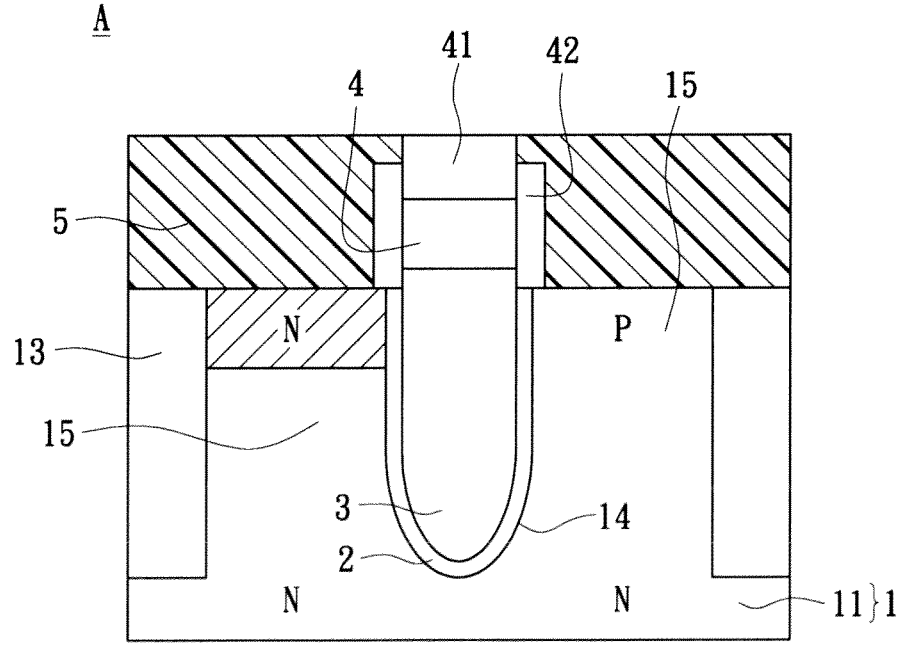
FIG. 6B shows a sectional view of FIG. 6A.

Please refer to FIGS. 6A and 6B, which corresponds to step S104. FIG. 6A shows a top view of the unit region A, wherein FIG. 6B is a sectional view of FIG. 6A. Insulating material is deposited to cover the formed structure of the unit region A from step S103, thus forming a insulating layer 5. Next, chemical-mechanical polishing/planarization (CMP) is applied to even the upper surface of the insulating layer 5 and the protective layer 41 (silicon nitride).

The above-described deposition process can be physical vapor deposition (PVD) or chemical vapor deposition (CVD). For industrial applications, the deposition technique is not limited thereto. The insulating material can be oxidized substance or other insulating materials.

Figure 7A:
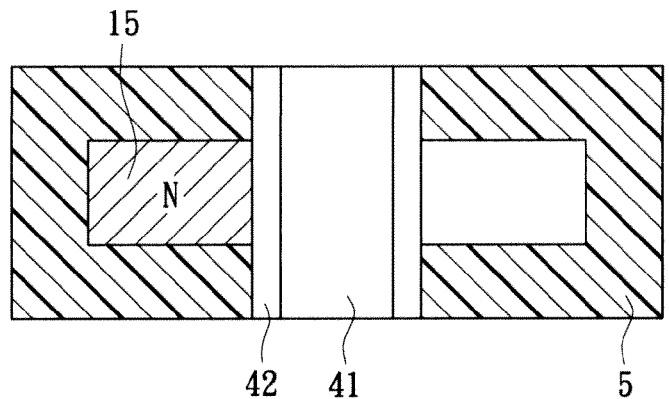
FIG. 7A shows a top view for a manufacturing step S105 of the instant disclosure.
Figure 7B:
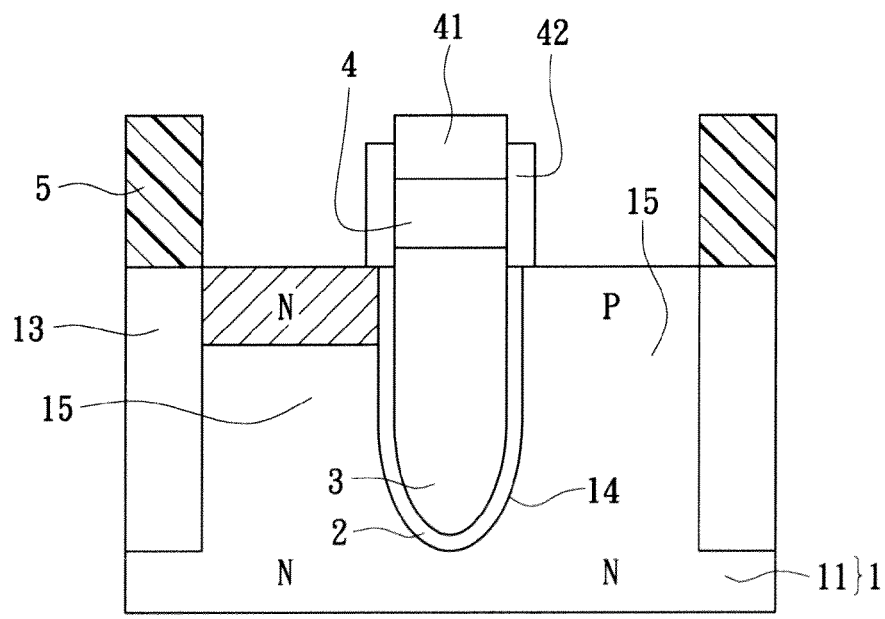
FIG. 7B shows a sectional view of FIG. 7A.

Please refer to FIGS. 7A and 7B, which corresponds to step S105. FIG. 7A shows a top view of the unit region A, wherein FIG. 7B is a sectional view of FIG. 7A. Self-align contact (SAC) process is used to remove the insulating layer 5 partially, for forming the source line pattern. In other words, the portion of the insulating layer 5 above the sidewall portions 15 of the active region 11 of the unit region A and adjacent to the spacing layers 42 are removed accordingly. Since SAC is a common technique used among semiconductor personnel, detailed description is omitted herein.

Figure 8A:
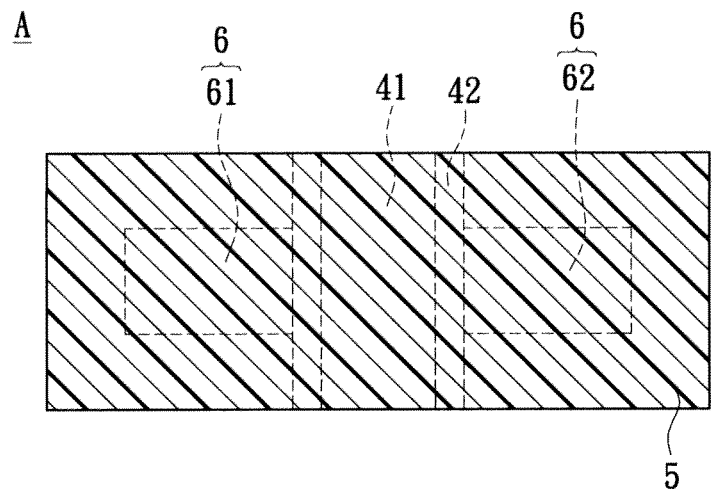
FIG. 8A shows a top view for a manufacturing step S106 of the instant disclosure.
Figure 8B:
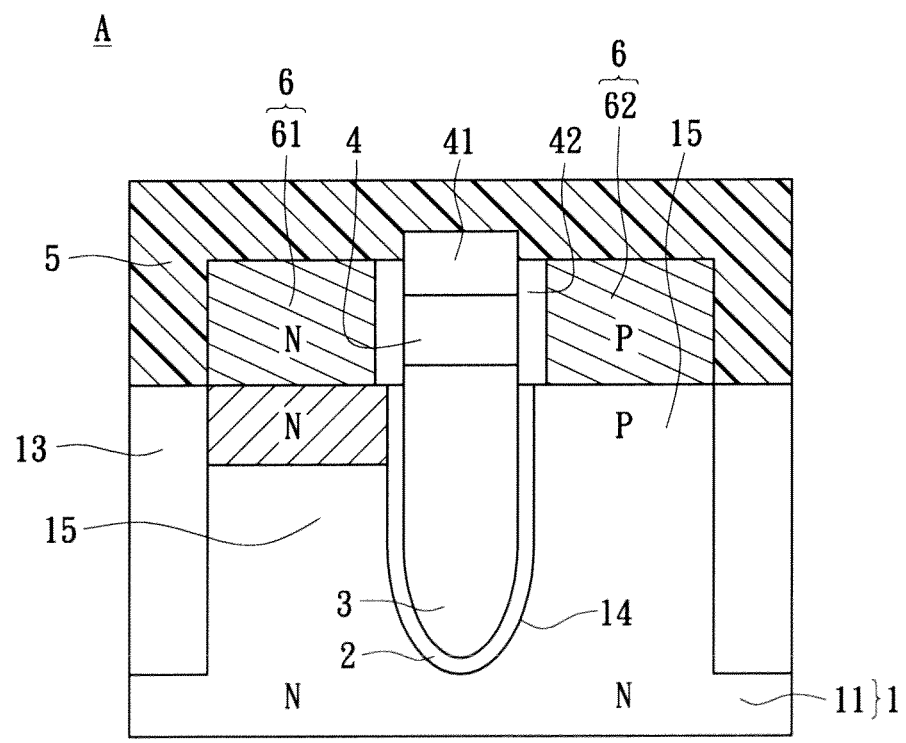
FIG. 8B shows a sectional view of FIG. 8A.

Please refer to FIGS. 8A and 8B, which corresponds to step S106. FIG. 8A shows a top view of the unit region A, wherein FIG. 8B is a sectional view of FIG. 8A. Next to the spacing layers 42 of the active region 11 of the unit region A, epitaxial deposition process is applied to from two floating bodies 6. Then, ions are implanted to the floating bodies 6 in similar fashion as sidewall portions 15 of the active region 11. In other words, an n-type floating body 61 and a p-type floating body 62 are formed adjacent to the respective spacing layer 42 on the sidewall portions 15 of the active region 11.

Insulating material is deposited over the above-described structure of the unit region A. Again using the CMP process, the upper surface of the insulating layer 5 is smoothed and evenly leveled for the unit region A.

Figure 9A:
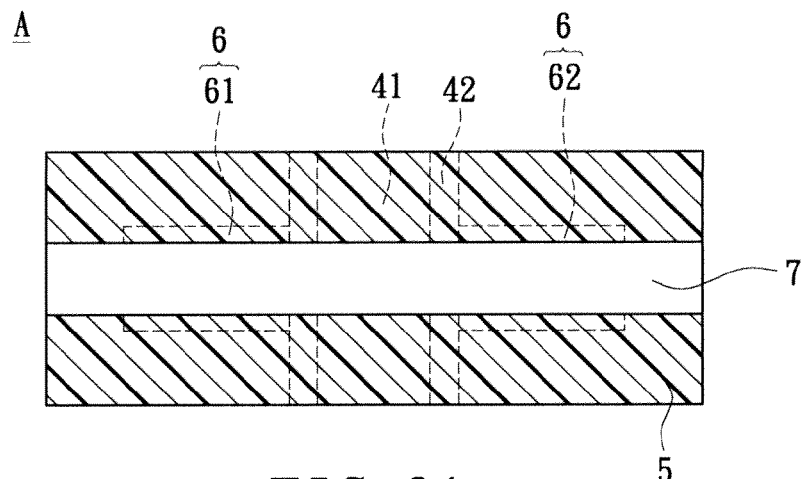
FIG. 9A shows a top view for a manufacturing step S107 of the instant disclosure.
Figure 9B:
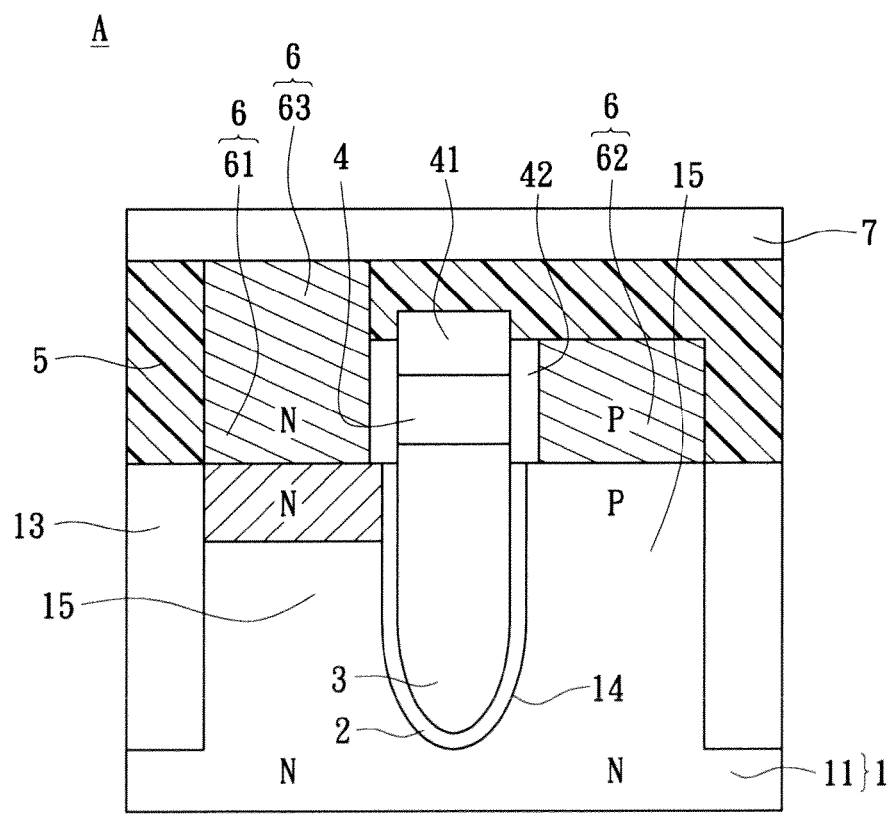
FIG. 9B shows a sectional view of FIG. 9A.

Please refer to FIGS. 9A and 9B, which corresponds to step S107. FIG. 9A shows a top view of the unit region A, wherein FIG. 9B is a sectional view of FIG. 9A. Self-align contact (SAC) technique is applied to remove the insulating layer 5 formed in the step S106 partially. More specifically, self-align contact process is used to remove the portion of insulating layer 5 corresponding to the n-type floating body 61. Then, polysilicon is deposited onto the upper portion of the n-type floating body 61 to form a source line contact end 63. Next, a source line 7 is formed perpendicularly to the word line 4 and connected to the source line contact 63. The source line 7 is not limited in length according to the figures, wherein other unit regions can share the same source line 7 in its path by connecting each source line contact end 63 to the source line 7.

Please refer to FIGS. 10A and 10B, which corresponds to step S108. FIG. 10A shows a top view of the unit region A, wherein FIG. 10B is a sectional view of FIG. 10A. Insulating material is deposited onto the formed structure of the unit region A from step S107. CMP technique is applied to smooth the surface of the deposited material in forming an insulating layer 8. Again. SAC technique is used to remove the portion of insulating layer 8 corresponding to the p-type floating body 62. Polysilicon is deposited to fill the void left by the removed insulating material corresponding to the p-type floating body 62, thus forming an n-type bit line contact end 64. In other words, the n-type bit line contact end 64 is an extension of the p-type floating body 62.

FIG. 11A shows a top view of the unit region A, wherein FIG. 11B is a sectional view of FIG. 11A. A bit line 9 is formed perpendicularly to the source line 7 and connected to the n-type bit line contact end 64, thus the vertical transistor is formed. In addition, the bit line 9 is not limited in length by the figures, which can be shared by other unit regions via connecting to each n-type bit line contact end 64.

Figure 12:
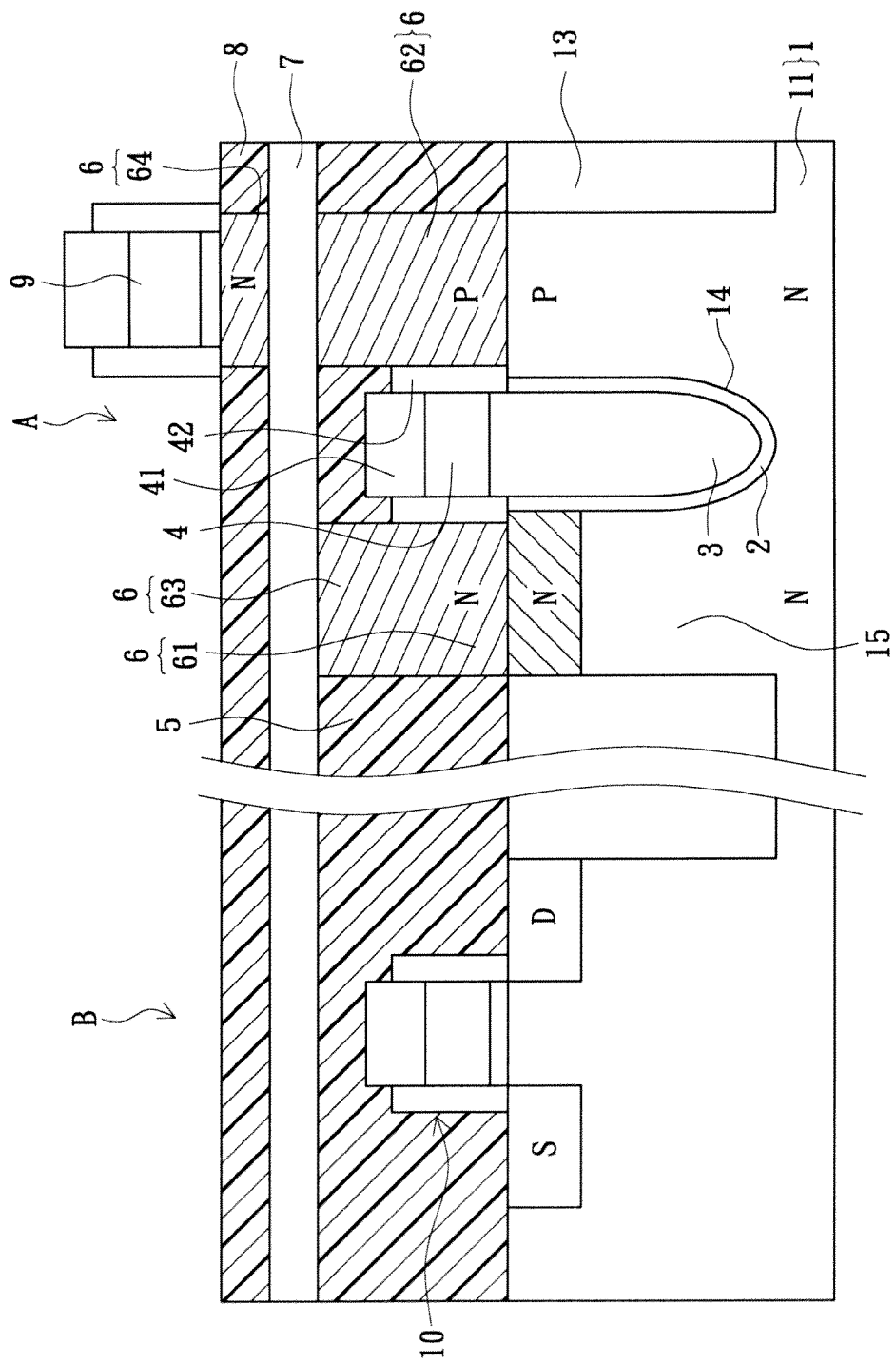
FIG. 12 shows a sectional view of disposing a planar transistor on an edge region B of the instant disclosure.

Based on the vertical transistor fabricated by the above-described method, a planar transistor 10 can also be disposed at the peripheral region B of the unit region A (as in FIG. 12). For example, when forming the above-described word line 4, the planar transistor 10 can be further formed at one side of the word line 4. Thus, when operating the memory device, voltage can be applied to the planar transistor 10, along with the source line 7 and bit line 9 of the vertical transistor. By modulating the applied voltage of the source line 7, the electric charge quantity of the transistor is controlled accordingly for maintaining a steady threshold voltage ($V_t$).

In addition, the word line 4, source line 7, and bit line 9 of the instant disclosure is formed respectively according to the above-described method. However, the fabrication sequence can be adjusted and not limited thereto. For example, the bit line 9 can be formed first, followed by forming the source line 7 and disposing it above the bit line 9.

Comparing to related art, the transistor fabricated by the manufacturing method of vertical transistor for random-access memory is added with the source line 7 to adjust the applied voltage for controlling the electric charge quantity, hence keeping a steady threshold voltage ($V_t$). In addition, the disclosed transistor is a vertical type, which can significantly reduce the occupied space in the horizontal direction, thus improving packing density of semiconductor elements.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A manufacturing method of vertical transistor for random-access memory, comprising:
    defining an active region on a semiconductor substrate;
    forming a shallow trench isolation structure around the active region;
    etching the central portion of the active region;
    forming a gate dielectric layer and a positioning gate on the etched portion of the active region;
    forming a word line in contact with the positioning gate and substantially perpendicular thereto in the etching direction;
    forming spacing layers on the outer surfaces of the word line;
    respectively forming an n-type region and a p-type region for the active region on opposite sides of the word line by ion implantation;
    coveringly disposing an insulating layer on the formed structure with an insulating layer;
    removing the insulating layer partially to form a source line pattern by a self-align contact (SAC) process;
    forming two floating bodies by epitaxial deposition and implanting with ions to form an n-type floating body on the n-type region of the active region and a p-type floating body on the p-type region of the active region; covering the formed structure with an insulating layer;
    removing the insulating layer corresponding to the n-type floating body by the self-align contact process; forming a source line perpendicular to the word line and connecting to the n-type floating body;
    covering the formed structure with an insulating layer and removing the insulating layer corresponding to the p-type floating body by the self-align contact process; and
    forming a bit line perpendicular to the source line and connecting to the p-type floating body.

2. The manufacturing method of vertical transistor for random-access memory of claim 1, wherein after the shallow trench isolation structure is formed, chemical-mechanical polishing (CMP) technique is used to smooth the surface of the semiconductor substrate and the shallow trench isolation structure, and wherein ions are implanted to form an n-type region for the lower portion of the semiconductor substrate and a p-type region for the upper portion of the semiconductor substrate.

3. The manufacturing method of vertical transistor for random-access memory of claim 1, further comprising the step of forming a protective layer on the word line.

4. The manufacturing method of vertical transistor for random-access memory of claim 3, wherein after disposing the insulating layer and prior to forming the source line pattern, chemical-mechanical polishing (CMP) technique is applied to smooth and level the upper portion of the insulating layer and the protective layer.

5. The manufacturing method of vertical transistor for random-access memory of claim 1, wherein self-align contact (SAC) technique is applied to remove the insulating layer above the active region and adjacent to the spacing layers to form the source line pattern.

6. The manufacturing method of vertical transistor for random-access memory of claim 1, wherein prior to forming the source line, polysilicon is deposited on the n-type floating body to form a source line contact end for connecting to the source line.

7. The manufacturing method of vertical transistor for random-access memory of claim 1, wherein prior to forming the bit line, polysilicon is deposited on the source line corresponding to the p-type floating body to form a bit line contact end for connecting to the bit line.

8. The manufacturing method of vertical transistor for random-access memory of claim 7, wherein the bit line contact end is an n-type.

9. The manufacturing method of vertical transistor for random-access memory of claim 1, wherein after forming the word line, a planar transistor is further formed on one side of the word line.

10. A vertical transistor for random-access memory fabricated by the manufacturing method of vertical transistor for random-access memory of claim 1.

* * * * *